United States Patent
Liu et al.

(10) Patent No.: US 10,903,305 B2
(45) Date of Patent: Jan. 26, 2021

(54) ULTRA HIGH DENSITY METAL-OXIDE-METAL CAPACITOR

(71) Applicant: Avago Technologies International Sales Pte. Limited, Singapore (SG)

(72) Inventors: Qing Liu, Irvine, CA (US); Akira Ito, Irvine, CA (US)

(73) Assignee: Avago Technologies International Sales Pte. Limited, Singapore (SG)

(*) Notice: Subject to any disclaimer, the term of this patent is extended or adjusted under 35 U.S.C. 154(b) by 86 days.

(21) Appl. No.: 16/109,467

(22) Filed: Aug. 22, 2018

(65) Prior Publication Data
US 2020/0066833 A1   Feb. 27, 2020

(51) Int. Cl.
*H01L 29/78*   (2006.01)
*H01L 49/02*   (2006.01)
*H01L 27/06*   (2006.01)
*H01L 23/522*  (2006.01)

(52) U.S. Cl.
CPC .......... *H01L 28/40* (2013.01); *H01L 23/5223* (2013.01); *H01L 27/0629* (2013.01); *H01L 29/785* (2013.01)

(58) Field of Classification Search
CPC ........ H01L 28/40–92; H01L 27/10829–10841
See application file for complete search history.

(56) References Cited

U.S. PATENT DOCUMENTS 10,020,311 B1 * 7/2018 Li ................ H01L 27/10817
2012/0081943 A1 * 4/2012 Schubert ............. G11C 11/22
                                                      365/145

* cited by examiner

*Primary Examiner* — Moazzam Hossain
*Assistant Examiner* — Hajar Kolahdouzan
(74) *Attorney, Agent, or Firm* — Foley & Lardner LLP (57) ABSTRACT

A capacitor includes a shallow trench isolation (STI) layer disposed on top of a substrate. The capacitor also includes a first dielectric layer disposed on top of the STI layer. The capacitor further includes a metallization diffusion (MD) layer disposed within both of the STI layer and the first dielectric layer.

20 Claims, 10 Drawing Sheets

ULTRA HIGH DENSITY METAL-OXIDE-METAL CAPACITOR

FIELD OF THE DISCLOSURE

The present invention relates generally to the field of fabricating a metal-oxide-metal capacitor and structure thereof including but not limited to fabricating an ultra high density metal-oxide-metal (MOM) capacitor for a Fin Field Effect Transistor.

BACKGROUND

A FinFET, also known as a Fin Field Effect Transistor, is non-planar transistor used in the design of modern processors. MOM capacitors have been widely used in integrated circuits (ICs) including FinFETs. It is desired to have capacitors with high capacitance in ICs including FinFETs as well as ICs including other devices. A MOM capacitor generally includes an oxide dielectric situated between adjacent metal plates, which form the electrodes of the MOM capacitor. Higher capacitance of the MOM capacitors requires larger silicon area, which increases the cost of the IC and/or reduces the density of FinFETs on the IC.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

DETAILED DESCRIPTION

Before turning to the features, which illustrate the exemplary embodiments in detail, it should be understood that the application is not limited to the details or methodology set forth in the description or illustrated in the figures. It should also be understood that the terminology is for the purpose of description only and should not be regarded as limiting.

MOM capacitors can be used in any type of ICs including but not limited to FinFET according to some embodiments. It is advantageous to have high capacitance for a MOM capacitor. In the back end of line processes for fabricating a MOM capacitor, low-k materials (low permittivity oxide) are used to reduce parasitic capacitance in some embodiments. The low-k materials make capacitance of the MOM capacitor lower and susceptible to a low breakdown voltage in some embodiments. Some embodiments of structures, systems and methods discussed herein advantageously fabricate MOM capacitors with more conductive structures using higher K dielectric materials to increase capacitance.

Referring generally to the figures, structures, systems and methods directed to a MOM capacitor (e.g., an ultra high density MOM capacitor) are shown according to various exemplary embodiments. A structure of the ultra high density MOM capacitor has multiple metallization layers, multiple oxide dielectric layers situated between the multiple metallization layers, and a metallization diffusion (MD) layer below the multiple metallization layers in some embodiments. Conductive traces are formed within one or more of the multiple metallization layers (e.g., M0, M1 . . . Mn) in some embodiments. In some embodiments, the multiple oxide dielectric layers include a layer at least part of which includes a shallow trench isolation (STI) structure (e.g., an STI layer). In some embodiments, at least a portion of the MD layer is formed within the STI structure or layer. In some embodiments, the MD layer is formed with ultra high density by forming the MD layer within the STI layer. In some embodiments, the MD layer has a larger depth compared to the multiple metallization layers. The structure of the ultra high density MOM capacitor provides higher capacitance in some embodiments. The structure of the ultra high density MOM capacitor does not require extra mask or process steps in some embodiments.

Some embodiments relate to a capacitor. The capacitor includes a STI layer, a first dielectric layer, and a MD layer. The STI layer is disposed on top of a substrate. The first dielectric layer is disposed on top of the STI layer. The MD layer is disposed within both of the STI layer and the first dielectric layer.

Some embodiments relate to a MOM capacitor for a FinFET. The MOM capacitor includes a STI layer, a first dielectric layer, and a MD layer. The STI layer is disposed on top of a substrate. The first dielectric layer is disposed on top of the STI layer. The MD layer is disposed within both of the STI layer and the first dielectric layer.

Some embodiments relate to a method of fabricating a capacitor. The method includes forming a STI layer on top of a substrate, forming a first dielectric layer on top of the STI layer; and forming a metallization diffusion layer within both of the first dielectric layer and the STI layer.

Figure 1:
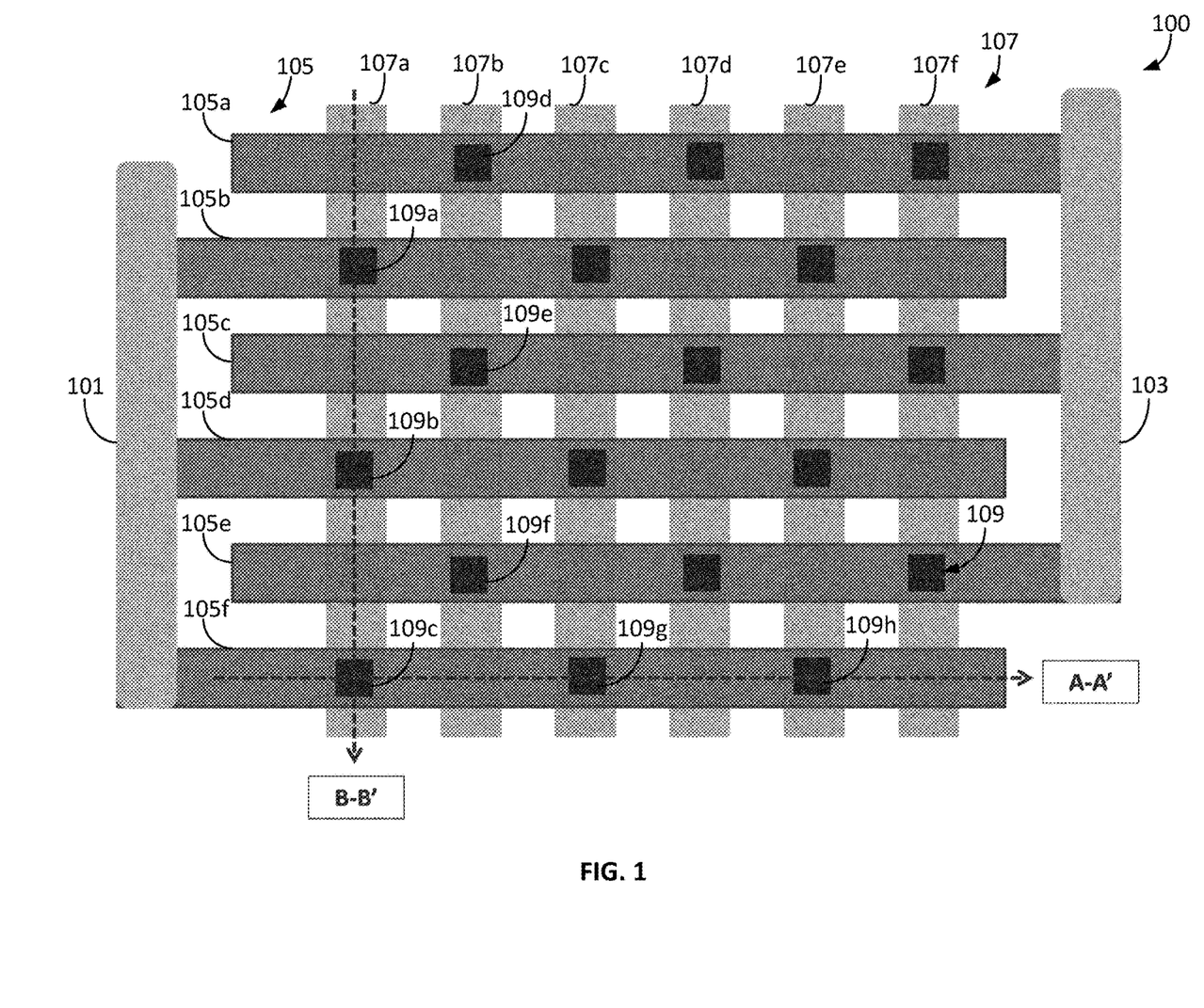
FIG. 1 is a planar top view schematic drawing of a MOM capacitor structure according to some embodiments.

Referring to FIG. 1, a MOM capacitor structure 100 includes a first terminal connector 101, a second terminal connector 103, multiple metallization layers (e.g., M0 layer 105), a MD layer 107, and multiple vias 109 according to some embodiments.

The first and the second terminal connectors 101 and 103 are formed on top of the multiple metallization layers according to some embodiments. One of the first and the second terminal connectors 101 is an anode terminal, and the other terminal connector is a cathode terminal according to some embodiments. The first and the second terminal connectors 101 and 103 are formed with any suitable conductive material (e.g., metal).

The multiple metallization layers are formed on top of each other and include an oxide dielectric layer between each two metallization layers according to some embodiments. The multiple metallization layers include the M0 layer 105, which is first layer from the bottom of the multiple metallization layers. For illustration purposes, only the M0 layer 105 is shown in FIG. 1 according to some embodiments. The other metallization layers can include same or different layout and structure compared to the M0 layer 105 and be part of the MOM capacitor structure 100 according to some embodiments. The multiple metallization layers include metal according to some embodiments. For example, the metallization layers can include metal from M0 layer through M15 layer, are separated from each other by interlayer dielectric material, and connected with each other by conductive vias according to some embodiments.

The M0 layer 105 includes multiple horizontal conductive traces 105*a*-105*f* according to some embodiments. The conductive traces 105*a-f* are connected to the first and the second terminal connectors 101 and 103 according to some embodiments. Adjacent conductive traces are connected to different terminal connectors so that the adjacent conductive traces have different polarity according to some embodiments. For example, the conductive trace 105*a* is connected to the first terminal connector 101, and the adjacent conductive trace 105*b* is connected to the second terminal connector 103 according to some embodiments. For example, the conductive traces 105*c* and 105*e* are connected to the first terminal connector 101, and the corresponding adjacent conductive traces 105*d* and 105*f* are connected to the second terminal connector 103 according to some embodiments. In some embodiments, the conductive traces 105*a*-105*f* are formed with same space size (e.g., pitch) between each two adjacent conductive traces. In some embodiments, the conductive traces 105*a*-105*f* are formed with different space size between the adjacent conductive traces.

The MD layer 107 includes multiple vertical conductive traces 107*a*-107*f* according to some embodiments. The MD layer 107 is formed below the M0 layer according to some embodiments. The conductive traces 107*a*-107*f* are formed orthogonally to the conductive traces 105-105*f* in some embodiments. The MD layer 107 is formed using any suitable conductive material, such as metal according to some embodiments. The space between the conductive traces 107*a*-107*f* is small (e.g., 57 nm) so that the MD layer 107 is formed with high density of the conductive traces according to some embodiments.

The multiple vias 109 connects the M0 layer 105 and MD layer 107 according to some embodiments. The vias 109 are formed using any suitable conductive material such as metal according to some embodiments. The multiple vias 109 are positioned in an alternate form to connect between the conductive traces 105*a*-105*f* and the conductive traces 107*a*-107*f* so that each two adjacent conductive traces 107*a*-107*f* have different polarity according to some embodiments. For example, the vias 109*a*, 109*b*, and 109*c* are connected to the conductive traces 105*b*, 105*d*, and 105*f*, which are all connected to the first terminal connector 101 and have the same polarity according to some embodiments. The vias 109*a*, 109*b*, and 109*c* are also connected to the conductive trace 107*a* so that the conductive trace 107*a* are connected to the first terminal connector 101 through the vias 109*a*, 109*b*, and 109*c*, and the conductive traces 105*b*, 105*d*, and 105*f* according to some embodiments. Similarly, the adjacent conductive trace 107*b* of the conductive trace 107*a* is connected to the second terminal connector 103 through the vias 109*d*, 109*e*, and 109*f*, and the conductive traces 105*a*, 105*c*, and 105*e* according to some embodiments. In this way, the conductive traces 107*a* and 107*b* have different polarity according to some embodiments.

Figure 2:
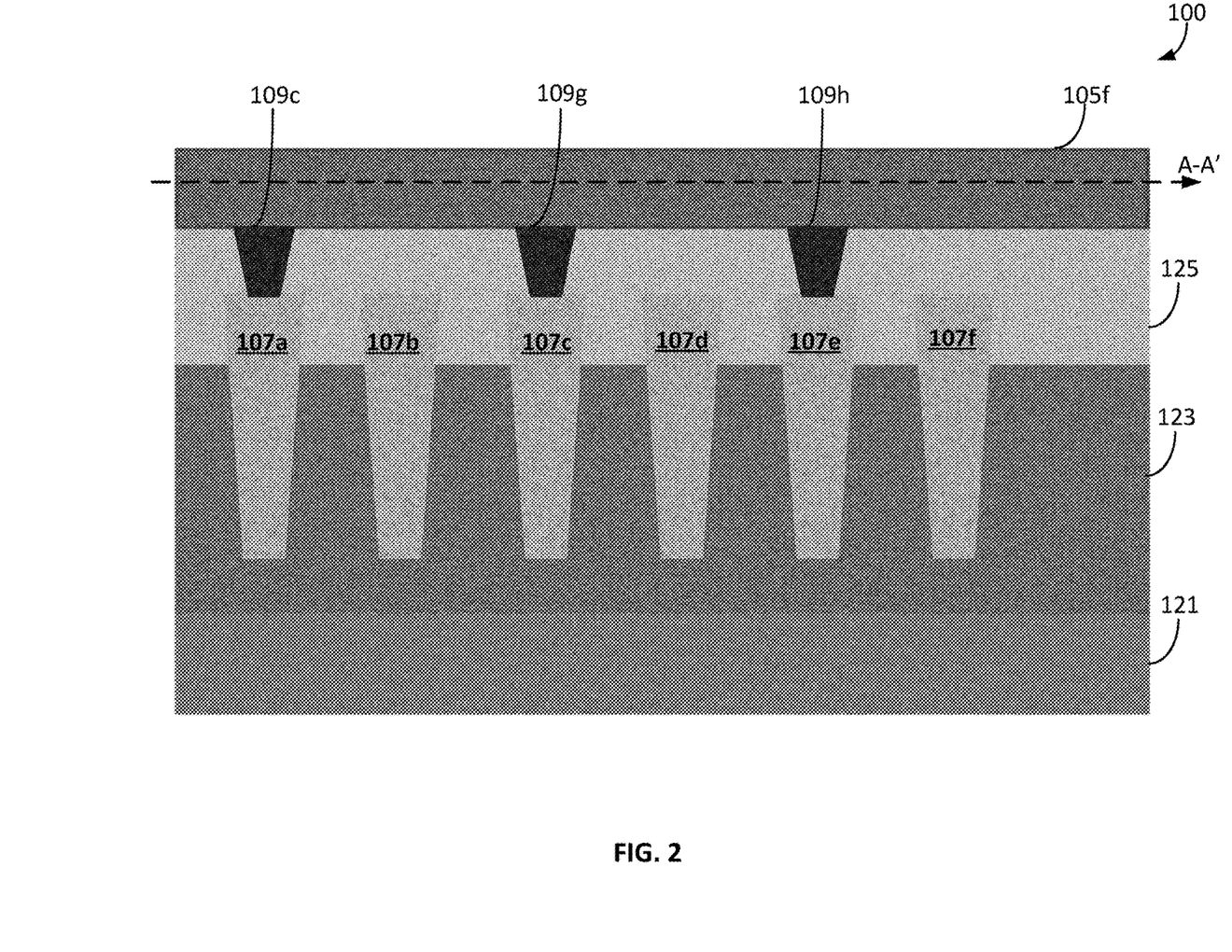
FIG. 2 is a cross-sectional view schematic drawing along an axis AA' of the MOM capacitor structure illustrated in FIG. 1 according to some embodiments.

With respect to FIG. 2, a cross-sectional view schematic drawing along an axis AA' of the MOM capacitor structure 100 illustrated in FIG. 1 is shown according to some embodiments. The MOM capacitor structure 100 further includes a substrate layer 121, an STI structure or STI layer 123, vias 109*g* and 109*h*, and a first dielectric layer 125 according to some embodiments.

The substrate layer 121 includes a bulk semiconductor substrate or a semiconductor-on-insulator (SOI) substrate according to some embodiments. In some embodiments, the substrate layer 121 can be formed using any suitable material, such as silicon, silicon germanium, germanium, etc.

The STI layer 123 is formed using any suitable insulating material, such as oxide, silicon dioxide, or other dielectric material according to some embodiments. The STI layer 123 is formed on top of the substrate 121 according to some embodiments. The STI layer 123 is formed on top of the substrate 121 by trench etching the substrate and filling or growing oxide material in the trench.

The first dielectric layer 125 is formed using any suitable insulating material, such as oxide, silicon dioxide, or other dielectric material according to some embodiments. The first dielectric layer 125 is formed by chemical vapor deposition in some embodiments The STI layer 123 and the first dielectric layer 125 are formed using different materials according to some embodiments. The first dielectric layer 125 is formed on top of the STI layer 123 and the substrate 121 according to some embodiments. The insulating material of the first dielectric layer 125 has lower quality (e.g., a lower permittivity (K), a lower reverse breakdown voltage) and dielectric constant compared to the STI layer 123 according to some embodiments.

The MD layer 107 associated with the conductive traces 107*a-f* is formed in both the first dielectric layer 125 and the STI layer 123 according to some embodiments. The vias 109*c-h* are formed within the first dielectric layer 125 and connect between the MD layer 107 and the M0 layer 105. The conductive traces 107*a*-107*f* of the MD layer 107 are formed with desired spaces between each two adjacent conductive traces according to some embodiments. The spaces between each two adjacent conductive traces are same according to some embodiments. The spaces between each two adjacent conductive traces can be different according to some embodiments. The MD layer 107 has a larger depth compared to the M0 layer 105 according to some embodiments. The MD layer 107 has a depth of 120 nm to 130 nm according to some embodiments. The MD layer 107 has a larger portion formed in the STI layer 123 than the portion formed in the first dielectric layer 125 according to some embodiments.

The vias 109*c*, 109*g*, and 109*h* are all connected to the conductive trace 105*f* of the M0 layer 105 and further connected to the first terminal connecter 101(FIG. 1) according to some embodiments. The vias 109*c*, 109*g*, and 109*h* are connected to the conductive traces 107*a*, 107*c*, and 107*e* respectively so that adjacent conductive traces 107*a*-107*f* have different polarity according to some embodiments. The vias 109*c*, 109*g*, and 109*h* are a conductive material, such as metal. The metal is deposited in holes etched in the layer 135 to reach the respective traces 107a, 107c, and 107e in some embodiments.

Figure 3:
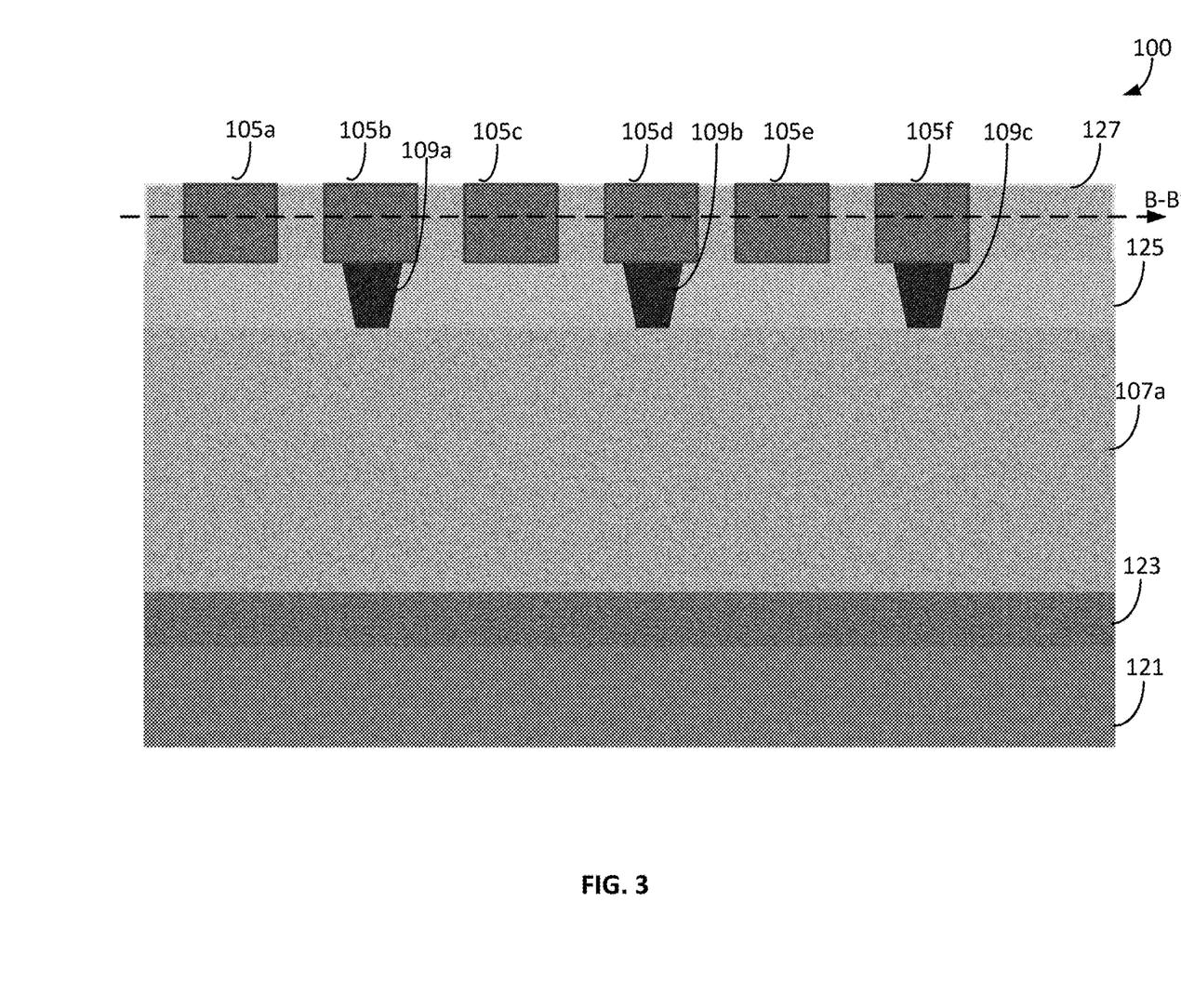
FIG. 3 is a cross-sectional view schematic drawing along an axis BB' of the MOM capacitor structure illustrated in FIG. 1 according to some embodiments.

With respect to FIG. 3, a cross-sectional view schematic drawing along an axis BB' of the MOM capacitor structure 100 illustrated in FIG. 1 is shown according to some embodiments. The MOM capacitor structure 100 further includes a second dielectric layer 127 according to some embodiments. The second dielectric layer 127 is formed on top of the first dielectric layer 125 according to some embodiments. The metallization layer 105 is formed within the second dielectric layer 127 according to some embodiments. The metallization layer 105 has same depth as the second dielectric layer 127 according to some embodiments. The second dielectric layer 127 is formed with any suitable dielectric material that has a low permittivity (K) and a low reverse breakdown voltage according to some embodiments. The second dielectric layer 127 has a lower quality (e.g., a lower permittivity (K), a lower reverse breakdown voltage) and a lower dielectric constant compared to the first dielectric layer 125 according to some embodiments.

As shown in FIG. 3, the MD layer 107a is formed in both the first dielectric layer 125 and the STI layer 123 according to some embodiments. The MD layer 107 has a larger depth compared to the M0 layer 105 according to some embodiments. The vias 109a, 109b, and 109c are all connected to the conductive trace 107a of the MD layer 107 according to some embodiments. The vias 109a, 109b, and 109c are also connected to the conductive traces 105b, 105d, and 105f, and further connected to the first terminal connector 101 according to some embodiments. In this way, the conductive trace 107a is connected to the conductive traces 105a m 105d, and 105f that have the same polarity according to some embodiments.

Figure 4:
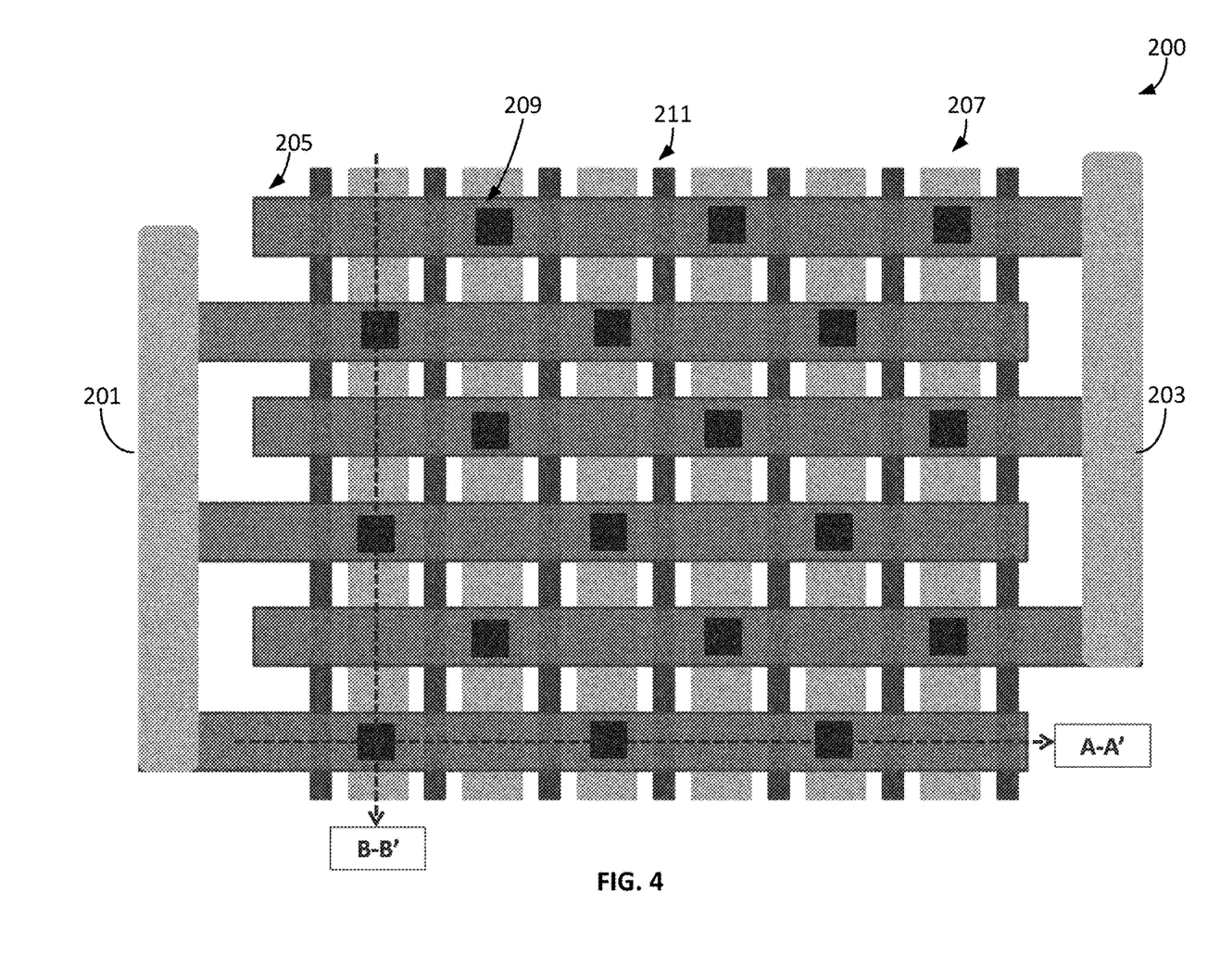
FIG. 4 is a planar top view schematic drawing of a MOM capacitor structure according to some embodiments.

With respect to FIG. 4, a perspective view schematic drawing of a MOM capacitor structure 200 is shown according to some embodiments. The MOM capacitor structure 200 includes a first terminal connector 201, a second terminal connector 203, multiple metallization layers (e.g., M0 layer 205), a MD layer 207, multiple vias 209, and multiple floating gates 211 according to some embodiments.

The first and the second terminal connectors 201 and 203 are similar as the terminal connectors 101 and 103 of the MOM capacitor structure 100 according to some embodiments. The multiple metallization layers including the M0 layer 205 are similar to the multiple metallization layers of the MOM capacitor structure 100 according to some embodiments. The multiple vias 209 are similar to the vias 109 of the MOM capacitor structure 100 according to some embodiments.

Each of the multiple floating gates 211 is formed between two adjacent conductive traces of the MD layer 207 according to some embodiments. The floating gates 211 have the same length as the conductive traces of the MD layer 207 according to some embodiments. The floating gates 211 are formed using any suitable gate material (e.g., metal gate, any conductive gate, polysilicon) according to some embodiments. The floating gates 211 provide additional relative permittivity compared to the dielectric material between the conductive traces of the MD layer 207 according to some embodiments. The floating gates 211 help increase capacitance density of the MOM capacitor structure 200 and help satisfy polysilicon density specifications during fabrication according to some embodiments. The floating gates 211 are utilized when the space between the conductive traces of the MD layer 207 is smaller than a space threshold according to some embodiments. For example, the floating gates 211 allow the MD layer 207 has a higher density or less pitch between conductive traces compared to the MD layer 107a ccording to foundry process minimum design rule check (DRC) rules in some embodiments.

Figure 5:
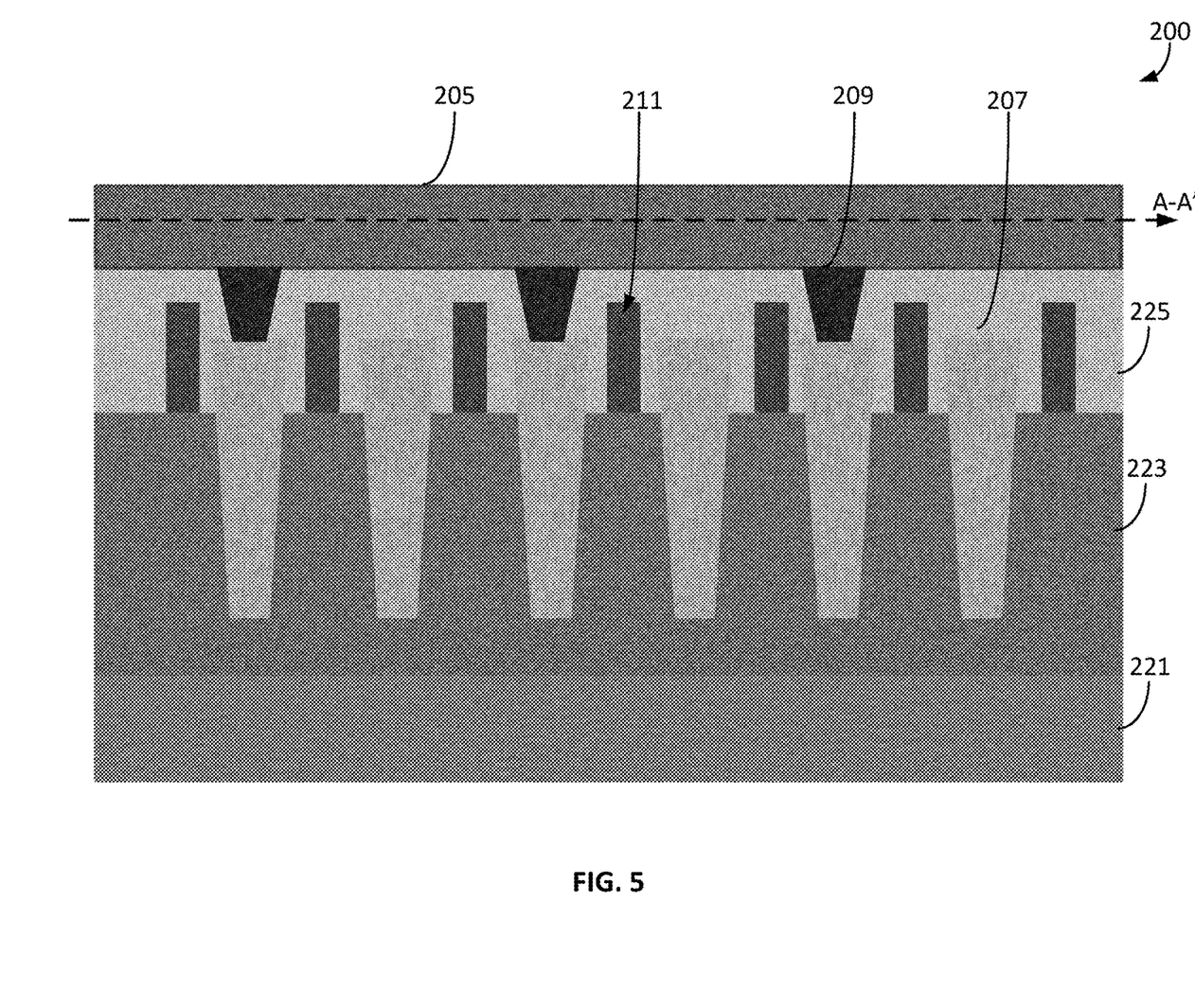
FIG. 5 is a cross-sectional view schematic drawing along an axis AA' of the MOM capacitor structure illustrated in FIG. 4 according to some embodiments.

With respect to FIG. 5, a cross-sectional view schematic drawing along an axis AA' of the MOM capacitor structure 200 illustrated in FIG. 4 is shown according to some embodiments. The MOM capacitor structure 200 further includes a substrate layer 221, a STI layer 223, and a first dielectric layer 225, which are similar as the substrate layer 121, the STI layer 123, and the first dielectric layer 125 of the MOM capacitor structure 100 respectively according to some embodiments. The floating gates 211 are formed on top of the STI layer 223 and within the first dielectric layer 225 according to some embodiments. The floating gates 211 are formed at both sides of each conductive trace of the MD layer 207 according to some embodiments. The floating gates 211 have width that is larger than the portion of the MD layer 207 that is within the first dielectric layer 225 according to some embodiments.

Figure 6:
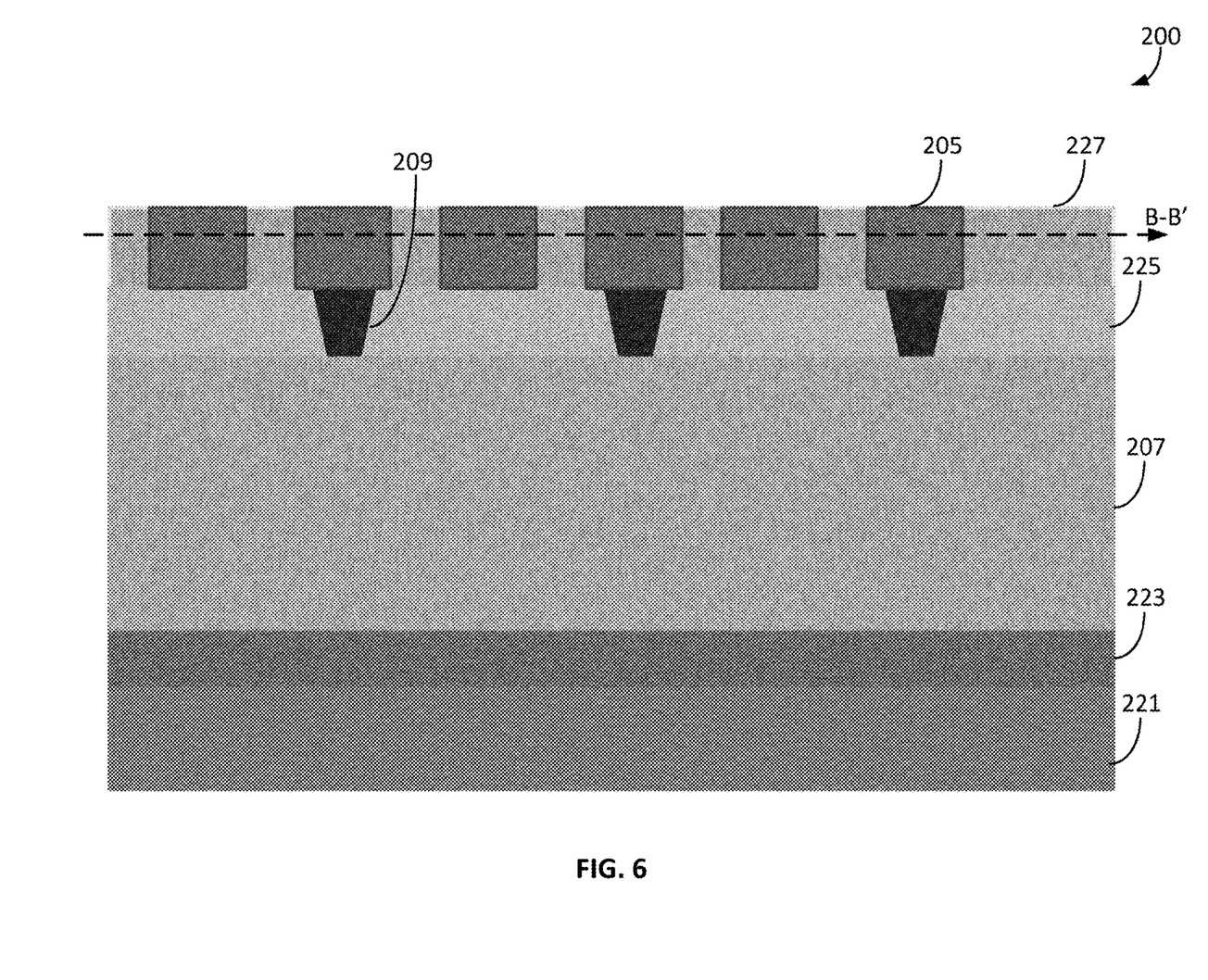
FIG. 6 is a cross-sectional view schematic drawing along an axis BB' of the MOM capacitor structure illustrated in FIG. 4 according to some embodiments.

With respect to FIG. 6, a cross-sectional view schematic drawing along an axis BB' of the MOM capacitor structure 200 illustrated in FIG. 4 is shown according to some embodiments. The MOM capacitor structure 200 further includes a second dielectric layer 227 that is similar to the second dielectric layer 127 according to some embodiments. The floating gates 211 do not reach the second dielectric layer 227 according to some embodiments.

Figure 7:
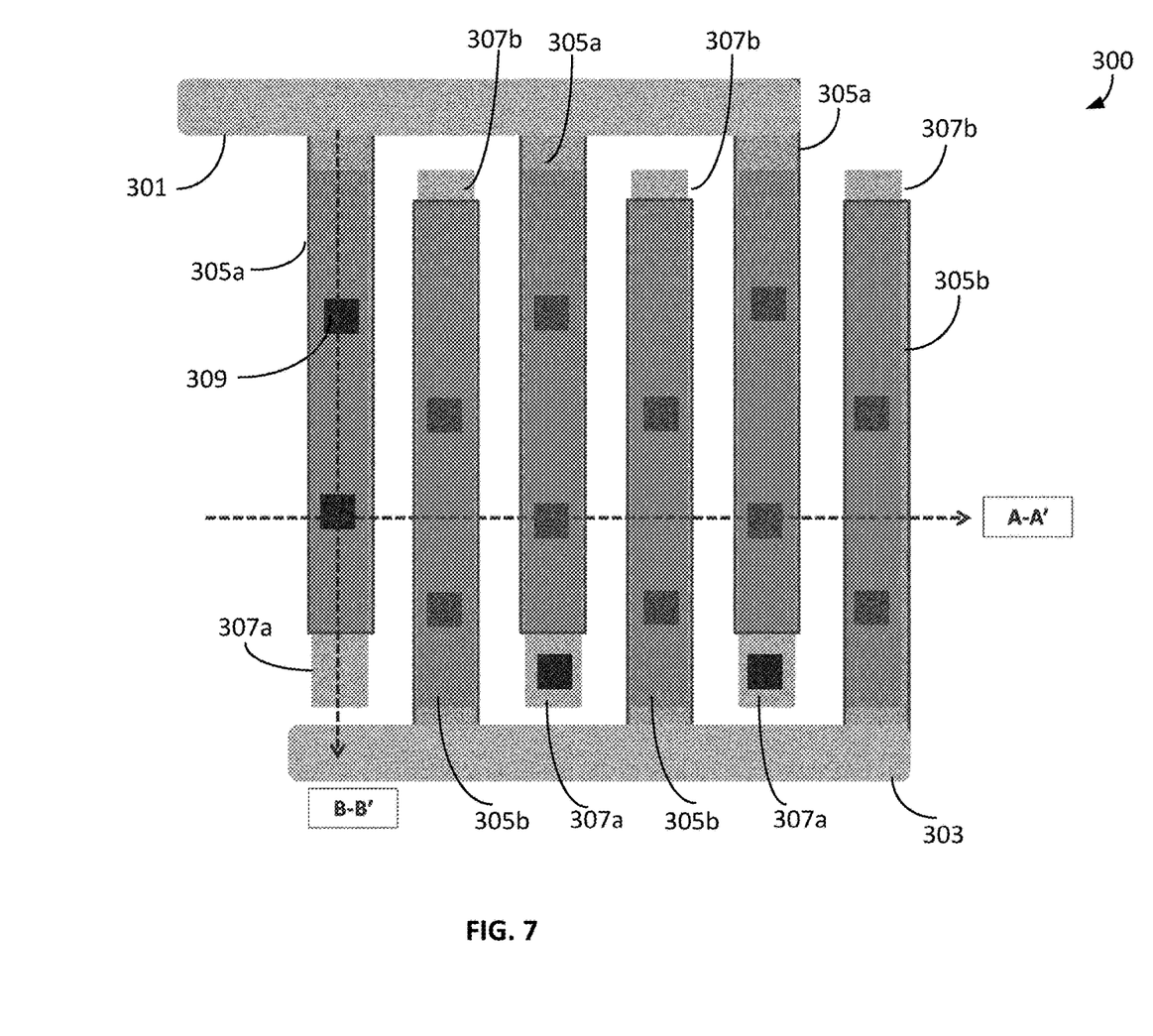
FIG. 7 is a planar top view schematic drawing of a MOM capacitor structure according to some embodiments.

With respect to FIG. 7, a MOM capacitor structure 300 includes a first terminal connector 301, a second terminal connector 303, a M0 layer 305, a MD layer 307, and multiple vias 309 according to some embodiments.

The first and the second terminal connectors 301 and 303 are similar to the first and the second terminal connectors 101 and 103 according to some embodiments. The M0 layer 305 includes multiple conductive traces 305a and 305b according to some embodiments. The MD layer 307 includes multiple conductive traces 307a and 307b formed in parallel with the BB' axis according to some embodiments. The conductive traces 305a are connected to the first terminal connector 301 according to some embodiments. The conductive traces 305b are connected to the second terminal connector 303 according to some embodiments. The conductive traces 305a and the conductive traces 305b are interleaved with each other so that no adjacent conductive traces have the same polarity by connecting to the same terminal connector according to some embodiments. The MD layer 307 is formed below the M0 layer 305 and overlapped with the M0 layer 305 so that each conductive traces 305a and 305b are disposed on top of a respective conductive traces 307a and 307b according to some embodiments. The vias 309 formed between the M0 layer 305 and the MD layer 307 connect the M0 layer 305 and the MD layer 307 according to some embodiments. Each conductive trace of the M0 layer 305 is connected to a respective conductive trace of the MD layer 307 through at least two vias 309 according to some embodiments.

The space between each two adjacent conductive traces of the M0 layer 305 is same as the space between each two adjacent conductive traces of the MD layer 307 according to some embodiments. The M0 layer 305 and the MD layer 307 has the same density of conductive traces according to some embodiments. The M0 layer 305 and the MD layer 307 are formed with any suitable conductive material, such as metal according to some embodiments. The M0 layer 305 and the MD layer 307 can be formed using same or different material according to some embodiments.

Figure 8:
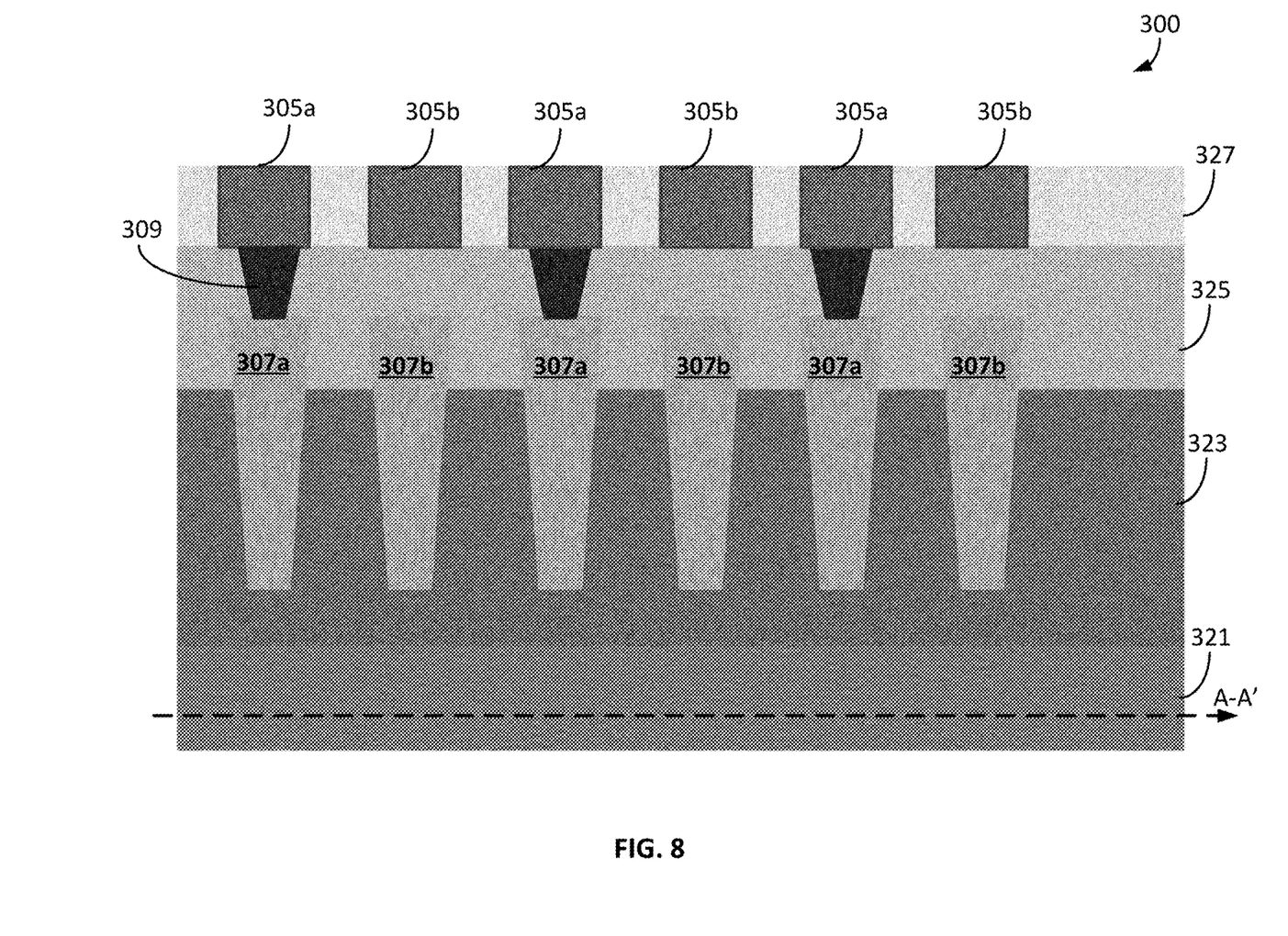
FIG. 8 is a cross-sectional view schematic drawing along an axis AA' of the MOM capacitor structure illustrated in FIG. 7 according to some embodiments.

With respect to FIG. 8, a cross-sectional view schematic drawing along an axis AA' of the MOM capacitor structure 300 illustrated in FIG. 7 is shown according to some embodiments. The MOM capacitor structure 300 further includes a substrate 321, a STI layer 323, a first dielectric layer 325, and a second dielectric layer 327 according to some embodiments. The substrate 321, the STI layer 323, the first dielectric layer 325, and the second dielectric layer 327 are similar as the substrate 121, the STI layer 123, the first dielectric layer 125, and the second dielectric layer127 respectively according to some embodiments.

The MD layer 307 is formed within both the first dielectric layer 325 and the STI layer 323 according to some embodiments. The conductive traces 307a and 307b are formed with the same layout as the conductive traces 305a and 305b so that each conductive trace of the M0 layer 305 is lined up vertically with a respective conductive trace of the MD layer 307 according to some embodiments.

Figure 9:
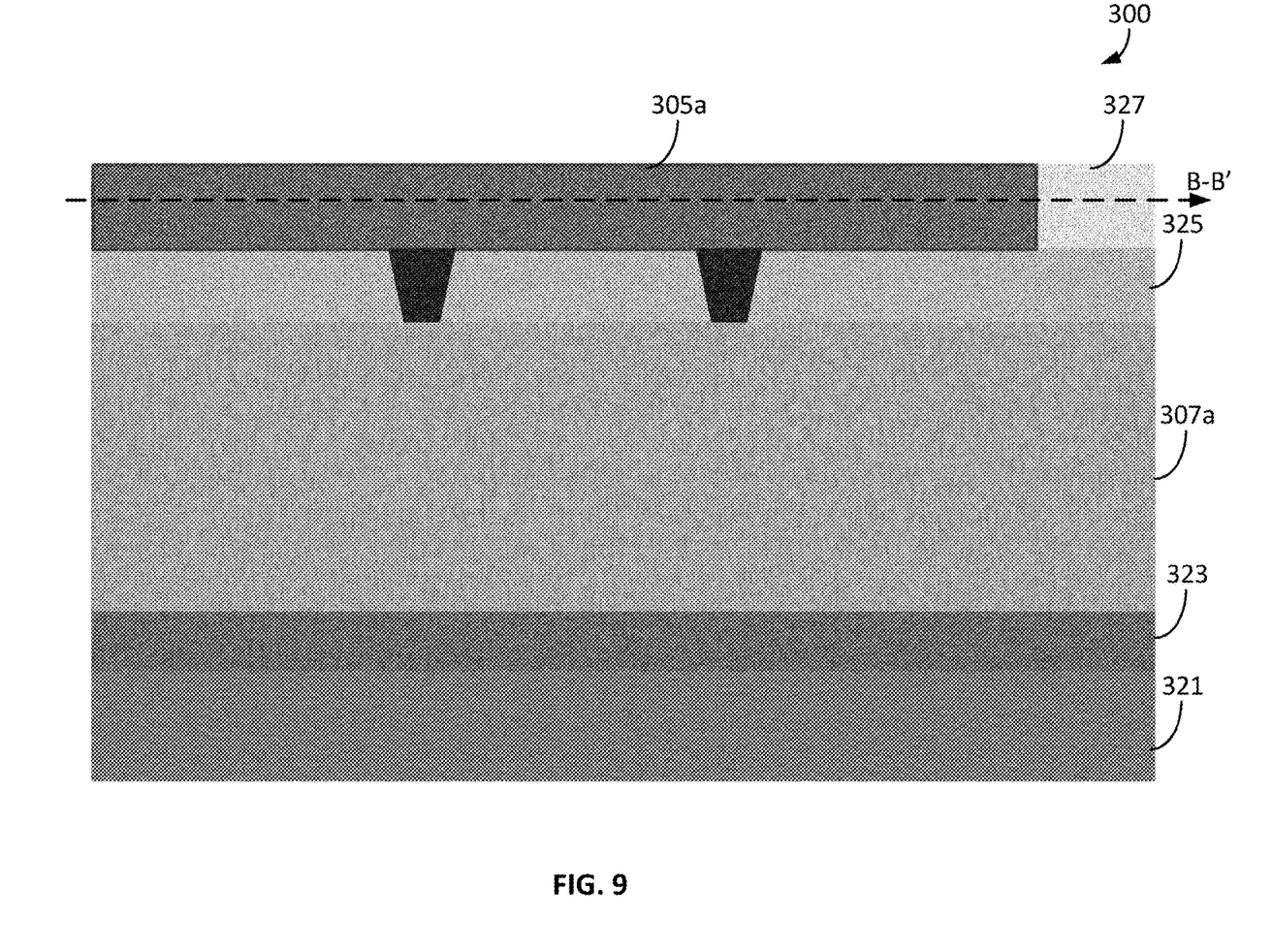
FIG. 9 is a cross-sectional view schematic drawing along an axis BB' of the MOM capacitor structure illustrated in FIG. 7 according to some embodiments.

With respect to FIG. 9, a cross-sectional view schematic drawing along an axis BB' of the MOM capacitor structure 300 illustrated in FIG. 7 is shown according to some embodiments. The conductive trace 305a is parallel with the conductive trace 307a according to some embodiments. The conductive trace 305a is connected to the conductive trace 307a through two vias 309 according to some embodiments. There can be any desired numbers of vias 309 formed to connect between the conductive traces 305a and 307a according to some embodiments. The conductive trace 305a is shorter compared to the conductive trace 307a along the axis BB' direction according to some embodiments. The MD layer 307 is deeper compared to the M0 layer 305 according to some embodiments. The deeper MD layer increases capacitance of the MOM capacitor structure 300 according to some embodiments.

Figure 10:
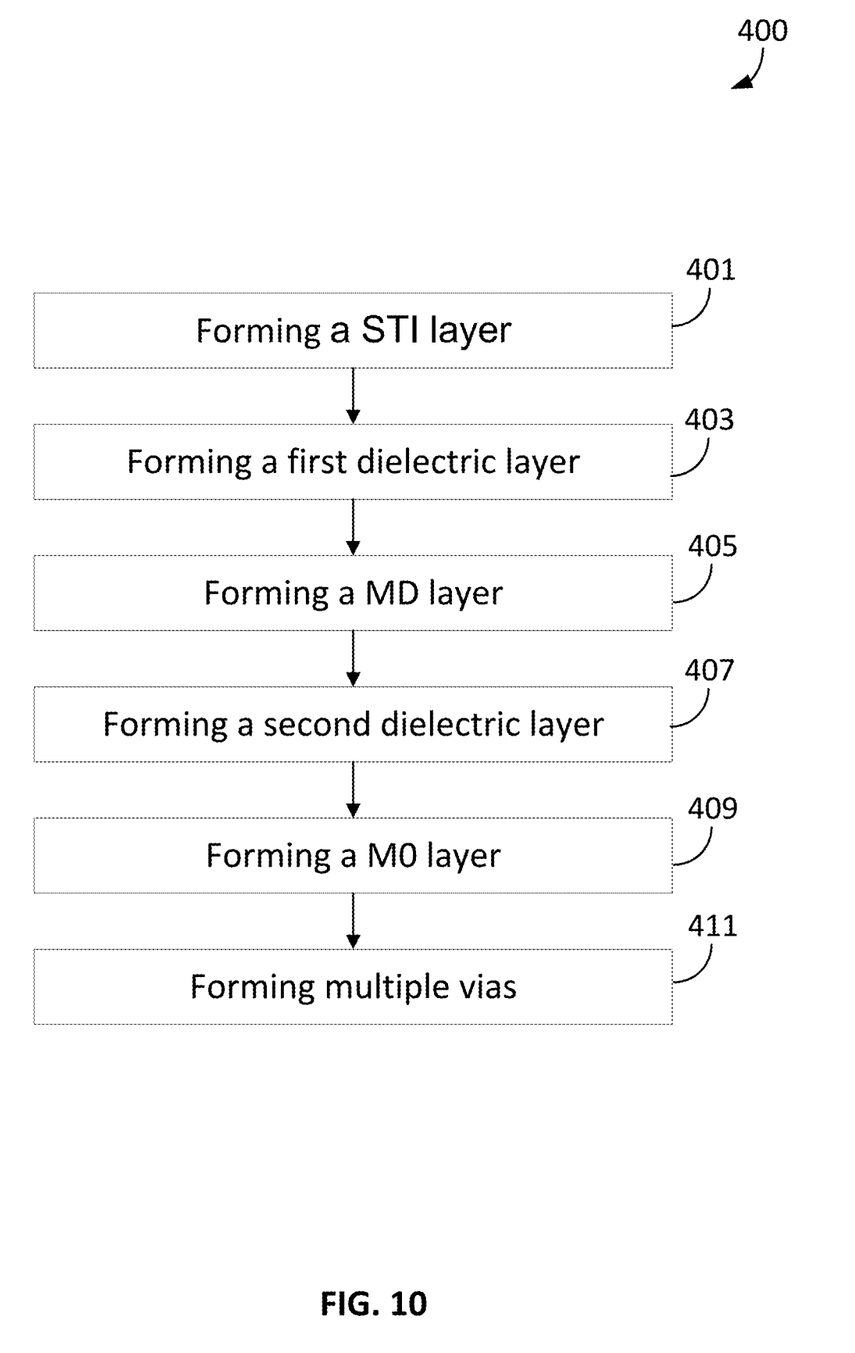
FIG. 10 is a flow diagram showing operations for fabricating a MOM capacitor structure according to some embodiments.

With respect to FIG. 10, a flow 400 for fabricating a MOM capacitor structure is shown according to some embodiments. At an operation 401, a STI layer is formed on top of a substrate. The STI layer is formed using high quality dielectric material using an STI operation according to some embodiments.

At an operation 403, a first dielectric layer is formed on top of the STI layer according to some embodiments. The first dielectric layer is formed using a dielectric material that has lower quality compared to the STI layer according to some embodiments.

At an operation 405, a MD layer is formed with both of the first dielectric layer and the STI layer according to some embodiments. A first portion of the MD layer is within the STI layer and a second portion of the MD layer is within the first dielectric layer according to some embodiments. The first portion of the MD layer has a larger depth compared to the second portion of the MD layer. The MD layer is formed with multiple conductive traces according to some embodiments. The multiple conductive traces are formed with a desired space between each two adjacent conductive traces according to some embodiments. The MD layer is formed with high density of conductive traces according to some embodiments. In some embodiments, multiple optional floating gates are formed when the density of the conductive traces of the MD layer reaches to a threshold density value. In some embodiments, there are floating gates formed at both sides of each conductive trace of the MD layer.

At an operation 407, a second dielectric layer is formed on top of the first electric layer according to some embodiments. The second dielectric layer is formed with a low-k dielectric insulating material (e.g., oxide) that has a lower quality (e.g., low permittivity and low reverse breakdown voltage) compared to the first dielectric layer according to some embodiments.

At an operation 409, a M0 layer is formed within the second dielectric layer according to some embodiments. The M0 layer is formed with a depth that is smaller than the depth of the MD layer according to some embodiments. The M0 layer is formed with any suitable conductive material such as metal (e.g., copper, aluminum and alloys thereof) according to some embodiments. The M0 layer is formed with multiple conductive traces according to some embodiments. A first set of the multiple conductive traces of the M0 layer are connected to a first terminal connector of the MOM capacitor according to some embodiments. A second set of the multiple conductive traces of the M0 layer are connected to a second terminal connector according to some embodiments. The first and the second terminal connectors are connected to an anode and a cathode respectively according to some embodiments. The first set of conductive traces of the M0 layer is formed with a layout interleaved with the second set of conductive traces so that any two adjacent conductive traces have different polarity according to some embodiments.

The conductive traces of the M0 layer and the conductive trances of the MD layer can be formed with a parallel layout (e.g., as shown in FIG. 7) or an orthogonal layout (e.g., as shown in FIG. 1 and FIG. 4) according to some embodiments. With the parallel layout, each conductive trance of the M0 layer is formed in parallel with a corresponding conductive trace of the MD layer according to some embodiments. With the orthogonal layout, the conductive traces of the M0 layer are orthogonal to the conductive traces of the MD layer according to some embodiments.

At an operation 411, multiple vias are formed to connect between the M0 layer and the MD layer according to some embodiments. The vias are disposed between the conductive traces of the M0 layer and the conductive traces of the MD layer so that each two adjacent conductive traces have different polarity according to some embodiments.

The disclosure is described above with reference to drawings. These drawings illustrate certain details of specific embodiments that implement the systems and methods and programs of the present disclosure. However, describing the disclosure with drawings should not be construed as imposing on the disclosure any limitations that are present in the drawings. No claim element herein is to be construed as a "means plus function" element unless the element is expressly recited using the phrase "means for." Furthermore, no element, component or method step in the present disclosure is intended to be dedicated to the public, regardless of whether the element, component or method step is explicitly recited in the claims.

It should be noted that certain passages of this disclosure can reference terms such as "first" and "second" in connection with devices for purposes of identifying or differentiating one from another or from others. These terms are not intended to relate entities or operations (e.g., a first layer and a second layer) temporally or according to a sequence, although in some cases, these entities can include such a relationship. Nor do these terms limit the number of possible entities or operations. Further, the term drain/source region refers to a source region, a drain region, or a region that can be used as a source or a drain.

It should be understood that the circuits described above can provide multiple ones of any or each of those components. In addition, the structures, circuits and methods described above can be adjusted for various system parameters and design criteria, such as shape, depth, thicknesses, etc. Although shown in the drawings with certain components directly coupled to each other, direct coupling is not shown in a limiting fashion and is exemplarily shown. Alternative embodiments include circuits with indirect coupling between the components shown.

It should be noted that although the flowcharts provided herein show a specific order of method steps, it is understood that the order of these steps can differ from what is depicted. Also two or more steps can be performed concurrently or with partial concurrence. Such variation will depend on the software and hardware systems chosen and on designer choice. It is understood that all such variations are within the scope of the disclosure.

While the foregoing written description of the methods and systems enables one of ordinary skill to make and use what is considered presently to be the best-mode thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

What is claimed is:

1. A capacitor comprising:
   a shallow trench isolation (STI) layer disposed on top of a substrate;
   a first dielectric layer disposed on top of the STI layer; and
   a metallization diffusion (MD) layer disposed between the STI layer and the first dielectric layer, the MD layer including a first conductive trace and a second conductive trace facing each other, a portion of the STI layer and a portion of the first dielectric layer disposed between the first conductive trace and the second conductive trace.

2. The capacitor of claim 1, further comprising a metallization layer disposed on top of the first dielectric layer.

3. The capacitor of claim 2, further comprising a plurality of vias connecting between the MD layer and the metallization layer.

4. The capacitor of claim 2, wherein the MD layer has a depth that is larger than a depth of the metallization layer.

5. The capacitor of claim 3, wherein the metallization layer comprises a plurality of conductive traces comprising:
   a first set of conductive traces connected to a first terminal connector; and
   a second set of conductive traces connected to a second terminal connector, wherein one of the first and the second terminal connector is connected to an anode, and the other one of the first and the second terminal connector is connected to a cathode.

6. The capacitor of claim 5, wherein the first set of conductive traces is disposed interleaved with the second set of conductive traces.

7. The capacitor of claim 5, wherein the MD layer comprises:
   a third set of conductive traces connected to the first set of conductive traces through one or more first vias of the plurality of vias; and
   a fourth set of conductive traces connected to the second set of conductive traces through one or more second vias of the plurality of vias.

8. The capacitor of claim 7, further comprising a plurality of floating gates, wherein each conductive trace of the MD layer has two of the floating gates disposed by both side of the conductive trace.

9. The capacitor of claim 1, wherein the STI layer has better dielectric quality and dielectric constant compared to the first dielectric layer.

10. A metal-oxide-metal (MOM) capacitor for a FinFET comprising:
    a shallow trench isolation (STI) layer disposed above a substrate along a first direction;
    a first dielectric layer disposed above the STI layer along the first direction; and
    a metallization diffusion (MD) layer disposed between the STI layer and the first dielectric layer, the MD layer including a first conductive trace and a second conductive trace facing each other along a second direction traversing the first direction, a portion of the STI layer and a portion of the first dielectric layer disposed between the first conductive trace and the second conductive trace.

11. The MOM capacitor of claim 10, further comprising a metallization layer disposed above the first dielectric layer along the first direction.

12. The MOM capacitor of claim 11, further comprising a plurality of vias connecting between the MD layer and the metallization layer.

13. The MOM capacitor of claim 11, wherein the metallization layer comprises a plurality of conductive traces comprising:
    a first set of conductive traces electrically connected to a third conductive trace in the metallization layer through corresponding vias, the first set of conductive traces including the first conductive trace; and
    a second set of conductive traces electrically connected to a fourth conductive trace in the metallization layer through corresponding vias, the second set of conductive traces including the second conductive trace.

14. The MOM capacitor of claim 13, wherein the first set of conductive traces is disposed interleaved with the second set of conductive traces.

15. The MOM capacitor of claim 13,
    wherein the third conductive trace and the fourth conductive trace extend along the first direction, wherein the third conductive trace and the fourth conductive trace separated from each other along a third direction traversing the first direction and the second direction.

16. The MOM capacitor of claim 15, further comprising a plurality of floating gates, wherein each conductive trace of the MD layer has two of the floating gates disposed by both side of the conductive trace.

17. The MOM capacitor of claim 11, wherein the MD layer has a depth along the first direction that is larger than a depth of the metallization layer along the first direction.

18. The MOM capacitor of claim 10, wherein the STI layer has better dielectric quality and dielectric constant compared to the first dielectric layer.

19. A method of fabricating a capacitor, comprising:
    forming a shallow trench isolation (STI) layer on top of a substrate;
    forming a metallization diffusion layer including a first conductive trace and a second conductive trace facing each other, a portion of the STI layer disposed between a first portion of the first conductive trace and a first portion of the second conductive trace; and
    forming a first dielectric layer on top of the STI layer and the metallization diffusion layer, a portion of the first dielectric layer disposed between a second portion of the first conductive trace and a second portion of the second conducive trace.

20. The method of claim 19, further comprising forming a metallization layer on top of the first dielectric layer, wherein the metallization layer is connected to the metallization diffusion layer through one or more vias.

* * * * *